(12) United States Patent
Kent (10) Patent No.: US 7,296,962 B2
(45) Date of Patent: Nov. 20, 2007

(54) SPLIT ASSEMBLY ROBOTIC ARM

(75) Inventor: Richard J. Kent, Newbury, NH (US)

(73) Assignee: Fabworx Solutions, Inc., Newbury, NH (US)

( * ) Notice: Subject to any disclaimer, the term of this patent is extended or adjusted under 35 U.S.C. 154(b) by 60 days.

(21) Appl. No.: 11/102,103

(22) Filed: Apr. 8, 2005

(65) Prior Publication Data

US 2005/0238474 A1 Oct. 27, 2005

Related U.S. Application Data (60) Provisional application No. 60/560,406, filed on Apr. 8, 2004.

(51) Int. Cl.
*B25J 17/00* (2006.01)
(52) U.S. Cl. .............. 414/744.5; 74/490.05; 901/28
(58) Field of Classification Search ............ 414/744.5, 414/744.2; 901/28; 74/490.05, 490.06; 464/160
See application file for complete search history.

(56) References Cited

U.S. PATENT DOCUMENTS

| | | | |
|---|---|---|---|
| 4,555,217 A * | 11/1985 | Wright | 414/735 |
| 5,333,986 A | 8/1994 | Mizukami et al. | 414/217 |
| 5,464,444 A * | 11/1995 | Farquharson et al. | 623/65 |
| 5,682,795 A | 11/1997 | Solomon et al. | 74/490.04 |
| 6,057,662 A * | 5/2000 | McAndrew et al. | 318/567 |
| 6,077,027 A | 6/2000 | Kawamura et al. | |
| 6,189,404 B1 * | 2/2001 | Hatake et al. | 74/490.03 |
| 6,222,337 B1 | 4/2001 | Kroeker et al. | 318/568.11 |
| 6,360,459 B1 * | 3/2002 | Brookhart et al. | 37/442 |
| 6,634,851 B1 | 10/2003 | Bonora et al. | 414/744.3 |
| 2002/0166404 A1* | 11/2002 | Rosheim | 74/490.06 |

OTHER PUBLICATIONS

"Wafer Transport Robot replaces processed wafer in 4 seconds"; Industrial News Room; Asyst Technologies, Inc.; www.industrialnewsroom.com/fullstory12450; five pages; May 13, 2004.
"Asyst's New AXYS Fastswap Advanced Wafer Transport Robot Reduces Wafer-Swap Times by 50-100 Percent"; Asyst Technologies Inc. Press Release; Jul. 12, 2002; 2 pages.

\* cited by examiner

*Primary Examiner*—Donald Underwood
(74) *Attorney, Agent, or Firm*—John A. Fortkart; Fortkart & Houston P.C.

(57) ABSTRACT

A robotic arm assembly (101) is provided which comprises a hub (103), a first arm segment (105) which is attached to the hub, and a second arm segment (107) which is attached to the first arm segment such that said second arm segment can rotate at least partially about its longitudinal axis.

19 Claims, 5 Drawing Sheets

SPLIT ASSEMBLY ROBOTIC ARM

CROSS-REFERENCE TO RELATED APPLICATIONS

This application claims priority to U.S. Ser. No. 60/560,406, filed Apr. 8, 2004, entitled "Robotic Arm Having Split Assembly," having the same inventors, and is incorporated herein by reference in its entirety.

TECHNICAL FIELD OF THE INVENTION

The present invention pertains generally to robotic arms, and more particularly, to wrist assemblies for robotic arms of the type useful in wafer processing equipment.

BACKGROUND OF THE INVENTION

Modern semiconductor processing systems include cluster tools that integrate a number of process chambers together in order to perform several sequential processing steps without removing the substrate from the highly controlled processing environment. These chambers may include, for example, degas chambers, substrate pre-conditioning chambers, cooldown chambers, transfer chambers, chemical vapor deposition chambers, physical vapor deposition chambers, and etch chambers. The combination of chambers in a cluster tool, as well as the operating conditions and parameters under which those chambers are run, are selected to fabricate specific structures using a specific process recipe and process flow.

Once the cluster tool has been set up with a desired set of chambers and auxiliary equipment for performing certain process steps, the cluster tool will typically process a large number of substrates by continuously passing them, one by one, through a series of chambers or process steps. The process recipes and sequences will typically be programmed into a microprocessor controller that will direct, control and monitor the processing of each substrate through the cluster tool. Once an entire cassette of wafers has been successfully processed through the cluster tool, the cassette may be passed to yet another cluster tool or stand alone tool, such as a chemical mechanical polisher, for further processing.

One example of a fabrication system of the type described above is the cluster tool disclosed in U.S. Pat. No. 6,222,337 (Kroeker et al.), and reproduced in FIGS. 1 and 2 herein. The magnetically coupled robot disclosed therein is equipped with robotic arms having a frog-leg type construction that are adapted to provide both radial and rotational movement of the robot blade within a fixed plane. The radial and rotational movements can be coordinated or combined to allow for pickup, transfer and deliver of substrates from one location within the cluster tool to another location. For example, the robotic arm may be used to move substrates from one processing chamber to an adjacent chamber.

Figure 1:
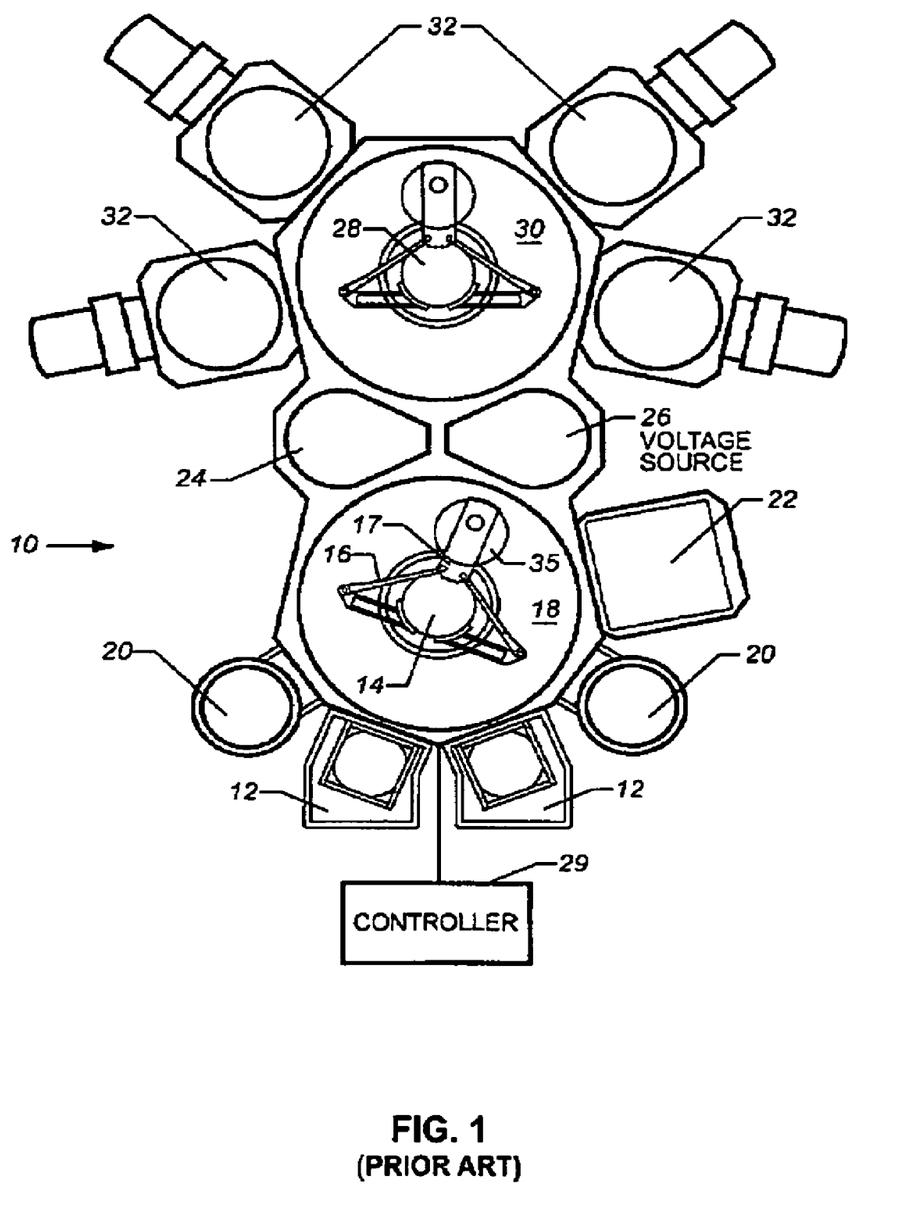
FIG. 1 is an illustration of a cluster tool equipped with a robotic wafer handling system.

FIG. 1 is a schematic diagram of the integrated cluster tool 10 of Kroeker et al. Substrates are introduced into, and withdrawn from, the cluster tool 10 through a cassette loadlock 12. A robot 14 having a blade 17 is located within the cluster tool 10 to transfer the substrates from one process chamber to another. These process chambers include cassette loadlock 12, degas wafer orientation chamber 20, preclean chamber 24, PVD TiN chamber 22 and cooldown chamber 26. The robot blade 17 is illustrated in the retracted position in which it can rotate freely within the chamber 18. A second robot 28 is located in transfer chamber 30 and is adapted to transfer substrates between various chambers, such as the cooldown chamber 26, preclean chamber 24, CVD Al chamber (not shown) and a PVD AlCu processing chamber (not shown). The specific configuration of chambers illustrated in FIG. 1 is designed to provide an integrated processing system capable of both CVD and PVD processes in a single cluster tool. A microprocessor controller 29 is provided to control the fabricating process sequence, conditions within the cluster tool, and the operation of the robots 14, 28.

Figure 2:
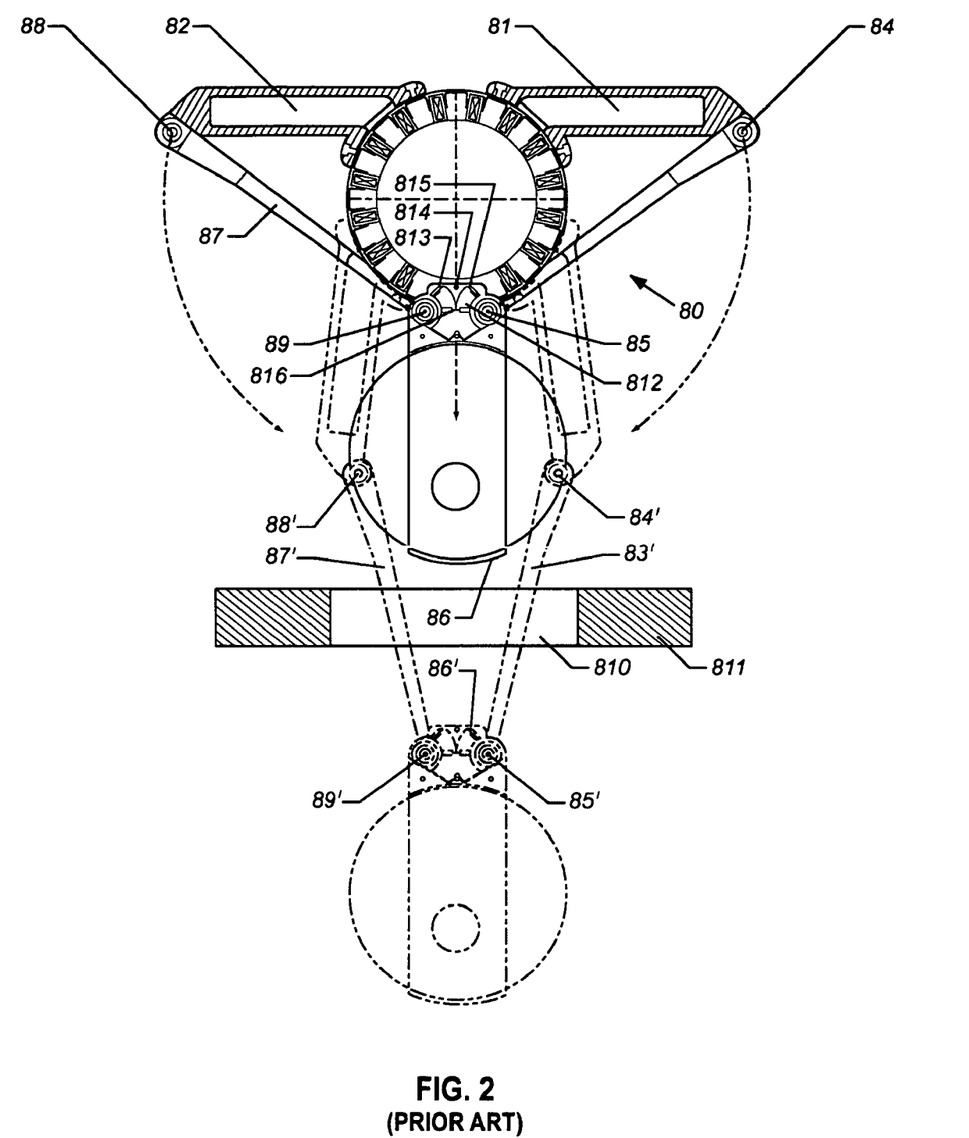
FIG. 2 is an illustration of the arm assembly of the robot depicted in FIG. 1, and illustrates the retracted and extended positions of the arm assembly.
Figure 3:
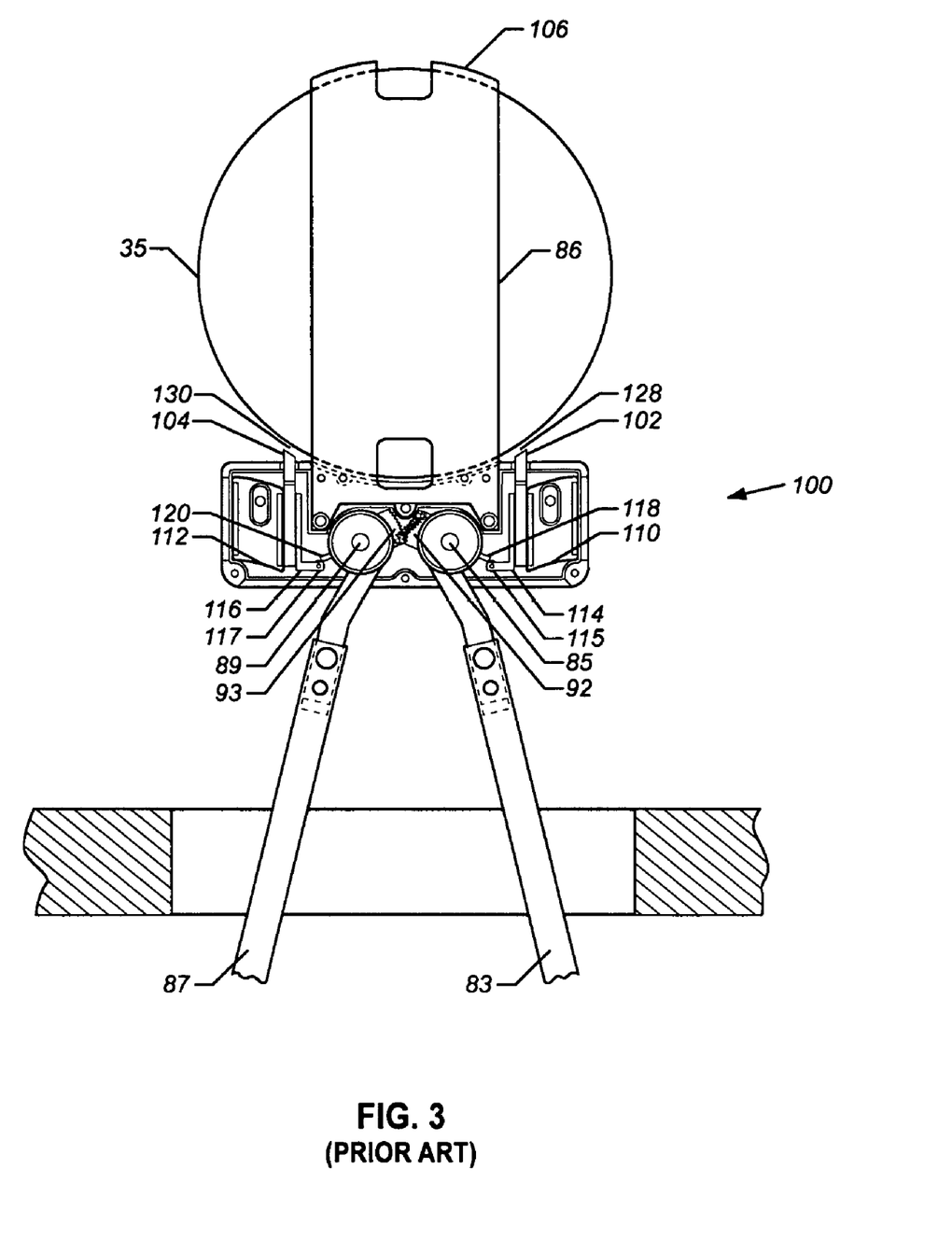
FIG. 3 is an illustration of the wrist assembly of the robot depicted in FIG. 1.

FIG. 2 is a schematic view of the magnetically coupled robot of FIG. 1 shown in both the retracted and extended positions. The robot 14 (see FIG. 1) includes a first strut 81 rigidly attached to a first magnet clamp 80 and a second strut 82 rigidly attached to a second magnet clamp 80'. A third strut 83 is attached by a pivot 84 to strut 81 and by a pivot 85 to a wafer blade 86. A fourth strut 87 is attached by a pivot 88 to strut 82 and by a pivot 89 to wafer blade 86. The structure of struts 81-83, 87 and pivots 84, 85, 88, and 89 form a "frog leg" type connection of wafer blade 86 to magnet clamps 80,80'.

When magnet clamps 80,80' rotate in the same direction with the same angular velocity, then the robot also rotates about axis x in this same direction with the same velocity. When magnet clamps 80, 80' rotate in opposite directions with the same absolute angular velocity, then there is no rotation of assembly 14, but instead there is linear radial movement of wafer blade 86 to a position illustrated by dashed elements 81'-89'.

A wafer 35 is shown being loaded on wafer blade 86 to illustrate that the wafer blade can be extended through a wafer transfer slot 810 in a wall 811 of a chamber 32 to transfer such a wafer into or out of the chamber 32. The mode in which both magnet clamps 80, 80' rotate in the same direction at the same speed can be used to rotate the robot from a position suitable for wafer exchange with one of the adjacent chambers 12, 20, 22, 24, 26 (see FIG. 1) to a position suitable for wafer exchange with another of these chambers. The mode in which both magnet clamps 80, 80' rotate with the same speed in opposite directions is then used to extend the wafer blade into one of these chambers and then extract it from that chamber. Some other combination of clamp rotation can be used to extend or retract the wafer blade as the robot is being rotated about axis x.

Figure 4:
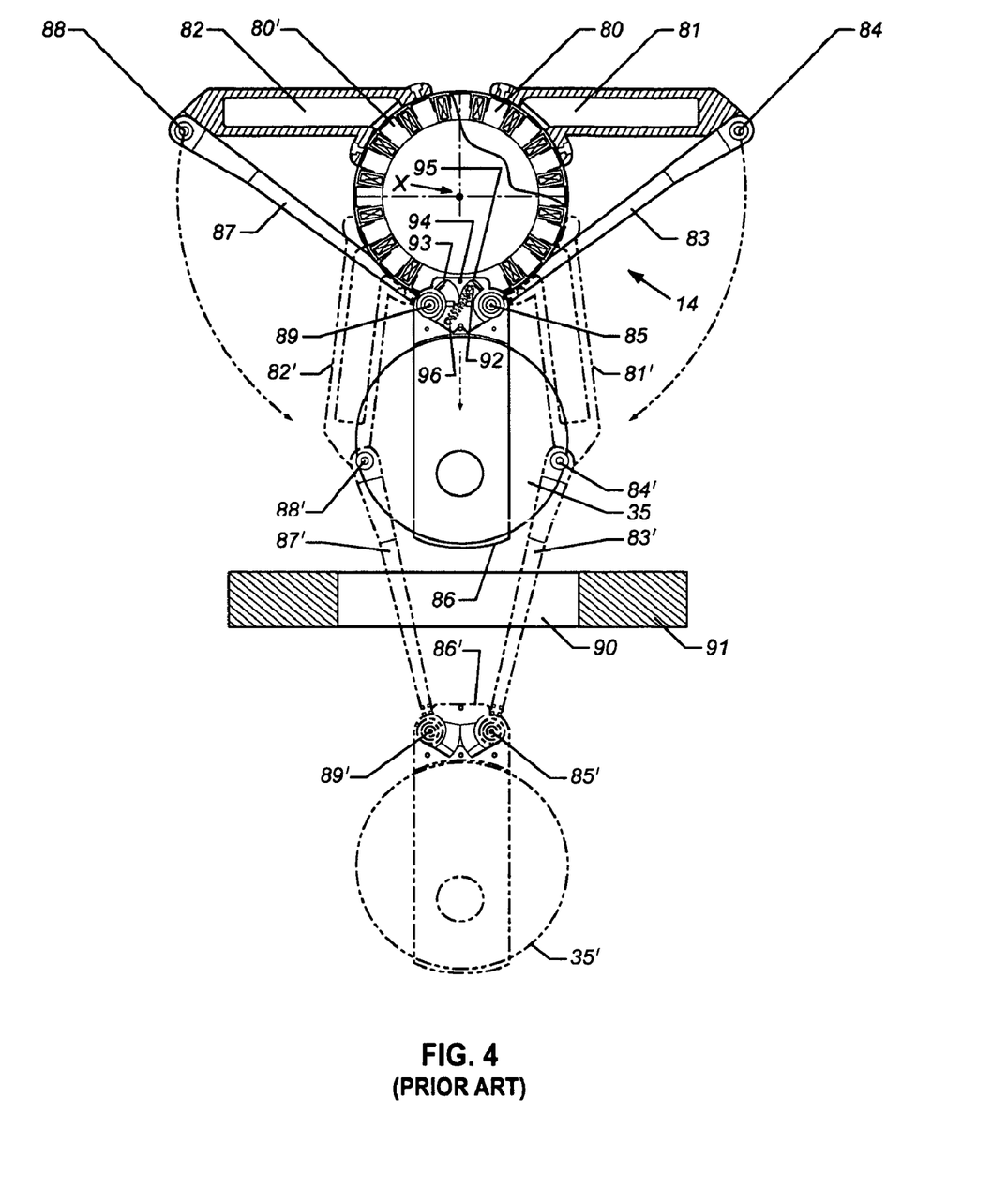
FIG. 4 is an illustration of a prior art robotic arm assembly and illustrates the retracted and extended positions of the arm assembly.

To keep wafer blade 86 directed radially away from the rotation axes x, an interlocking mechanism is used between the pivots or cams 85, 89 to assure an equal and opposite angular rotation of each pivot. The interlocking mechanism may take on many designs. One possible interlocking mechanism is a pair of intermeshed gears 92 and 93 formed on the pivots 85 and 89. These gears are loosely meshed to minimize particulate generation by these gears. To eliminate play between these two gears because of this loose mesh, a weak spring 94 (see FIG. 4) may be extended between a point 95 on one gear to a point 96 on the other gear such that the spring tension lightly rotates these two gears in opposite directions until light contact between these gears is produced.

Although robots of the type depicted in U.S. Pat. No. 6,222,337 (Kroeker et al.) have many desirable features, robots of this type also have some shortcomings. In particular, it has been found that robots of this type often exhibit excessive wear in the wrist 85', 89' and elbow 84', 88' joints. This problem results in excessive maintenance requirements and interruptions to the manufacturing process. There is thus a need in the art for a robotic assembly which requires less maintenance and exhibits less wear in these areas. These and other needs are met by the devices and methodologies disclosed herein and hereinafter described.

SUMMARY OF THE INVENTION

In one aspect, a robotic arm assembly is provided which comprises a hub, a first arm segment attached to the hub, and a second arm segment attached to the first arm segment (e.g., by way of a pin or other suitable means) such that the second arm segment can rotate at least partially about its longitudinal axis. The robotic arm assembly, which preferably has a frog-leg design, may further comprise a third arm segment which is pivotally connected to the second arm segment, an end effector (to which the third arm segment may be attached), a fourth arm segment attached to the hub, and a fifth arm segment attached to the fourth arm segment such that the fifth arm segment can rotate at least partially about its longitudinal axis. The robotic arm assembly may further comprise a sixth arm segment which is pivotally connected to the fifth arm segment and which is also connected to the end effector. Preferably, the third and sixth arm segments are attached to opposing sides of the end effector, preferably by way of wrist assemblies.

In another aspect, a robotic arm assembly is provided which comprises a hub, a lower arm attached to said hub, a forearm pivotally attached to said lower arm, and an end effector attached to said forearm, wherein said lower arm comprises a first segment which is rotatably connected to a second segment.

In still another aspect, a robotic arm assembly is provided herein which comprises a hub, a first arm segment attached to said hub, and a second arm segment attached to said first arm segment such that said second arm segment can move with respect to said first arm segment in such a way as to relieve stress on the arm.

One skilled in the art will appreciate that the various aspects of the present disclosure may be used in various combinations and sub-combinations, and each of those combinations and sub-combinations is to be treated as if specifically set forth herein.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

The aforementioned needs are met by the devices and methodologies disclosed herein. In particular, after careful investigation, it has now been found that, in conventional robotic arms of the type illustrated in FIGS. 1-4, the hub assembly can move out of concentricity with its piece parts and force the lower arm to roll away from the rotating hub axis. For example, in some known robotic arm configurations, the hub to which the arm is attached contains three concentric rings. The top and bottom rings in this configuration house bearings and are attached to the arm, and the middle ring houses one or more rare earth magnets for the magnetic coupling drive. In use, these rings can deviate from concentricity, thus causing the aforementioned roll.

In a frog-leg construction such as that depicted in FIGS. 1-4, this roll is transferred along the beam of the lower arm such that the arm is now out of parallelism with the second half of the frog arm. This condition induces stress within the wrist, elbow and hub assemblies, causing premature wear and adding abnormal motions in the z-direction (the direction perpendicular to the plane in which the arms extend and retract) as the arm is in motion. The devices and methodologies disclosed herein provide a means for compensating for this roll, thus eliminating such premature wear and allowing the robotic arm to operate properly.

Figure 5:
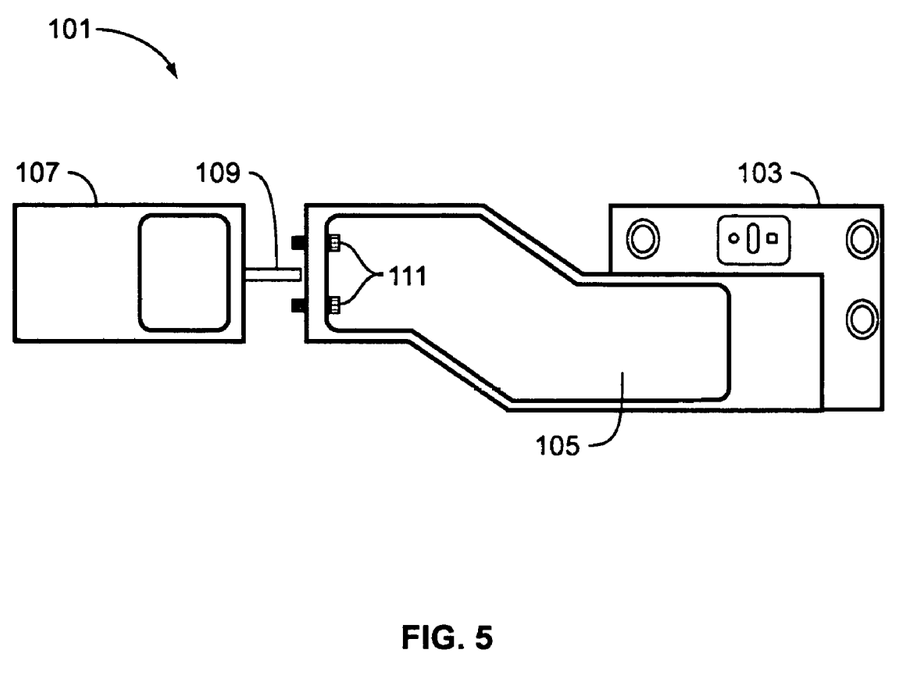
FIG. 5 is an illustration of one embodiment of a robotic arm made in accordance with the teachings herein.

FIG. 5 illustrates one non-limiting embodiment of the lower portion of a robotic arm made in accordance with the teachings herein. Some of the details of the robotic arm have been eliminated for simplicity of illustration. The robotic arm 101 comprises a hub 103, a first segment 105 which is attached to one or more rotating rings or columns in the hub, and a second segment 107 which is attached to the first segment by way of a pin 109.

The first segment 105 and second segment 107 are fastened together with a set of bolts 111 which mate with a set of threaded apertures (not shown) provided in the second element 107. The throughput for the bolts in the first segment is sufficiently larger than the bolt itself such that the first element can rotate slightly around the axis of the pin 109 when the bolt is sufficiently loosened and when the arm is subjected to roll. Preferably, this rotation is within the range of ±2° which, though small, is sufficient to relieve the stress that would otherwise be placed on the wrist and elbow assemblies. Hence, the two-part construction of the lower arm depicted in FIG. 5 allows a rotation to occur to compensate for the out-of-axis roll and to keep the entire arm balanced.

While FIG. 5 illustrates one particular means by which roll (and the accompanying stress) may be compensated for, one skilled in the art will appreciate that this objective may be achieved through a number of different means. For example, the first and second segments in FIG. 5 could be connected across a bearing assembly which permits limited rotation of these segments with respect to each other. It will thus be appreciated that these various means are within the scope of the present invention. Thus, although particular embodiments of the devices and methodologies disclosed herein have been described in detail, it should be understood that various changes, substitutions and alterations can be made hereto without departing from the spirit and scope of the invention.

What is claimed is:

1. A robotic assembly, comprising:
    a pin;
    a first arm segment;
    a second arm segment which rotates about its longitudinal axis and about the longitudinal axis of said pin;
    at least one fastener adapted to loosely fasten said first arm segment to said second arm segment, thereby restricting the angle of rotation of the second arm segment about said pin; and an end effector;

wherein said fastener extends through an aperture provided in said first segment.

2. The robotic assembly of claim 1, further comprising a second fastener adapted to loosely fasten said first arm segment to said second arm segment.

3. The robotic assembly of claim 1, comprising first and second arms, and wherein said first arm comprises said first and second arm segments.

4. The robotic assembly of claim 3, further comprising a hub having first and second rotatable rings mounted thereon, and wherein said first and second arms are attached to said first and second rings, respectively.

5. The robotic assembly of claim 1, wherein said second segment is connected to said end effector.

6. The robotic arm assembly of claim 1, wherein said second segment is attached to said end effector by way of a wrist assembly.

7. The robotic arm assembly of claim 1, wherein said aperture is sufficiently larger than said fastener so as to permit said second segment to rotate about its longitudinal axis with respect to said first segment.

8. The robotic arm assembly of claim 1, wherein said aperture is sufficiently larger than said fastener so as to permit said second segment to rotate about its longitudinal axis with respect to said first segment within the range of ±2° with respect to said first segment.

9. The robotic arm assembly of claim 1, wherein said end effector comprises a planar blade.

10. A robotic assembly, comprising:
a hub having first and second rotatable rings mounted thereon; and
first and second arms attached to said first and second rings, respectively;
wherein each of said first and second arms comprises a first component which is pivotally connected to a second component, wherein said first component comprises first and second segments, and wherein said second segment is attached to said first segment such that said second segment can rotate at least partially about its longitudinal axis.

11. The robotic assembly of claim 10, further comprising an end effector, and wherein said first and second arms are attached to said end effector.

12. The robotic assembly of claim 10, wherein said first component of said first arm is attached to said first ring, and wherein said first component of said second arm is attached to said second ring.

13. The robotic assembly of claim 11, wherein said second component of each of said first and second arms is connected to said end effector.

14. The robotic arm assembly of claim 11, wherein said second component of each of said first and second arms is attached to said end effector by way of a wrist assembly.

15. The robotic arm assembly of claim 10, further comprising a fastener which joins said first and second segments, and wherein said fastener extends through an aperture provided in said first segment.

16. The robotic arm assembly of claim 15, wherein said aperture is sufficiently larger than said fastener so as to permit said second segment to rotate about its longitudinal axis with respect to said first segment.

17. The robotic arm assembly of claim 15, wherein said aperture is sufficiently larger than said fastener so as to permit said second segment to rotate about its longitudinal axis with respect to said first segment within the range of ±2° with respect to said first segment.

18. The robotic arm assembly of claim 11, wherein said end effector comprises a planar blade.

19. The robotic arm assembly of claim 10, wherein said first and second arms pivot in opposite directions.

* * * * *

UNITED STATES PATENT AND TRADEMARK OFFICE
CERTIFICATE OF CORRECTION

PATENT NO.        : 7,296,962 B2                                              Page 1 of 1
APPLICATION NO.   : 11/102103
DATED             : November 20, 2007
INVENTOR(S)       : Richard J. Kent It is certified that error appears in the above-identified patent and that said Letters Patent is hereby corrected as shown below:

On the Title page, at (74) Attorney, Agent, or Firm, please delete "John A. Fortkart; Fortkart & Houston P.C.," and replace therefore with -- John A. Fortkort; Fortkort & Houston P.C. --.

Signed and Sealed this

Twenty-third Day of September, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,296,962 B2 |
| APPLICATION NO. | : 11/102103 |
| DATED | : November 20, 2007 |
| INVENTOR(S) | : Richard J. Kent |

It is certified that error appears in the above-identified patent and that said Letters Patent is hereby corrected as shown below:

On the Title page, at (74) Attorney, Agent, or Firm, please delete John A. Fortkart; Fortkart & Houston P.C., and replace therefore with -- John A. Fortkort; Fortkort & Houston P.C. --.

Signed and Sealed this

Fourteenth Day of October, 2008

JON W. DUDAS
*Director of the United States Patent and Trademark Office*